United States Patent [19]

Iwasa et al.

[11] Patent Number: 5,770,346
[45] Date of Patent: Jun. 23, 1998

[54] PHOTORESIST AND COMPOUNDS FOR COMPOSING THE PHOTORESIST

[75] Inventors: Shigeyuki Iwasa; Kaichiro Nakano; Katsumi Maeda; Takeshi Ohfuji; Etsuo Hasegawa, all of Tokyo, Japan

[73] Assignee: NEC Corporation, Tokyo, Japan

[21] Appl. No.: 763,055

[22] Filed: Dec. 10, 1996

[30]         Foreign Application Priority Data

Dec. 11, 1995  [JP]  Japan  ................................. 7-322039
Sep. 4, 1996   [JP]  Japan  ................................. 8-234228

[51] Int. Cl.[6] ............................................. G03F 7/039
[52] U.S. Cl. ........................ 430/270.1; 560/181; 526/323; 430/315
[58] Field of Search ............................. 430/285.1, 270.1

[56]                  References Cited

FOREIGN PATENT DOCUMENTS 227660   6/1990  Japan .
5134416  5/1993  Japan .

OTHER PUBLICATIONS

R.D. Allen, G. M. Wallraff, R.A. Dèpietro, D.C. Hofer, and R.R. Kunz; Journal of Photopolymer Science and Technology 7(3), 507–516, 1994.
Resist Materials for Short Wavelength, 1988, pp. 16–21.
H. Ito et al; "Applications of Photoinitiators to the Design of Resists for Semiconductor Manufacturing"; Polymers in Microelectronics; American Chemical Society (1984); pp. 11–23.
K. Nakano et al.; "Positive Chemically Amplified Resist for ArF Excimer Laser Lithography ... Terpolymer"; SPIE, vol. 2438; pp. 433–444.
R. D. Allen et al.; "Single Layer Resists with Enhanced Etch Resistance for 193 nm Lithography"; Journal of Photopolymer Science and Technology, vol. 7, No. 3 (1994); pp. 507–516.

T. Sakamizu et al., "Acid–Catalyzed of Tetrahydropyranyl–Protected Polyvinylphenol in a Novolak–Resin–Based Positive Resist"; Jpn. J. Appl. Phys., vol. 31 (1992), pp. 4288–4293.

(List continued on next page.)

*Primary Examiner*—Joseph L. Schofer
*Assistant Examiner*—Wu C. Cheng
*Attorney, Agent, or Firm*—Whitham, Curtis, Whitham & McGinn

[57]                  ABSTRACT

There is provided a photoresist including (a) a resin composed of a polymer having a compound represented with the following general formula [1] within a structural unit thereof, and (b) a photo acid generator.

wherein $R^1$ represents a hydrogen atom, $R^2$ represents a divalent hydrocarbon group including a bridged cyclic hydrocarbon group and having a carbon number in the range of 7 to 13 both inclusive, $R^3$ and $R^4$ represent a hydrocarbon group having a carbon number of 1 or 2, and $R^5$ represents one of (a) a hydrocarbon group having a carbon number of 1 to 12, (b) a hydrocarbon group having a carbon number of 1 to 12 and replaced with an alkoxy group having a carbon number of 1 to 12, and (c) a hydrocarbon group having a carbon number of 1 to 12 and replaced with an acyl group having a carbon number of 1 to 13. The above mentioned photoresist produces no extra polymer by side reaction. Thus, the photoresist makes it possible to form a fine pattern without resist residue, and has superior thermal stability.

11 Claims, 1 Drawing Sheet

OTHER PUBLICATIONS

J.V. Crivello et al.; "A New Preparation of Triarylsulfonium and –selenonium Salts via the Copper(II) . . . Salts"; J. Org. Chem., vol. 43, No. 15, 1978, pp. 3055–3058.

O. Nalamasu et al.; Development of a Chemically Amplified Positive (CAMP) Resist Material for Single Layer Deep–UV Lithography; SPIE, vol. 1262 Advances in Resist Technology and Processing VII (1990), pp. 32–48.

T. Ueno et al; "Chemical Amplification Positive Resist Systems Using Novel Sulfonates as Acid Generators"; Proceedings of PME '89 (1990), pp. 413–424.

PHOTORESIST AND COMPOUNDS FOR COMPOSING THE PHOTORESIST

BACKGROUND OF THE INVENTION

1. Field of the Invention

The present invention relates to a photoresist and compounds of which the photoresist is made, and further relates to a method of forming a resist pattern by using the photoresist.

2. Description of the Related Art

In a field of manufacturing various electronic devices such as VLSI in which sub-micron order patterns are required to form, an electric device is now required to have higher densification and integration. Thus, an improved lithography technique for forming a more minute pattern on a substrate is required for satisfying such a requirement.

As one of methods for forming a more minute pattern is known a method in which an exposure light having a shorter wavelength is used for forming a resist pattern. For instance, there has been used i-line of high-pressure mercury vapor lamp, which has a wave length of 365 nm, as a light source for forming a dynamic random access memory (DRAM) having an integration of 64M bits or less. In a mass production of a 0.25 µm-rule 256M bits DRAM, it is now being expected that the i-line is replaced with KrF excimer laser, as an exposure light source, having a shorter wavelength than that of the i-line, more specifically, having a wavelength of 248 nm. However, the fabrication of 0.18 µm-rule 1G bits or greater DRAM which requires a technique for forming a more fine patterns needs a light source having a shorter wavelength than that of KrF excimer laser to be developed. For that purpose, an ArF excimer laser having a wavelength of 193 nm now attracts attention as a light source to be used in photolithography. For instance, the utilization of ArF excimer laser is discussed by T. Ueno, T. Iwayanagi, K. Nono, H. Ito and C. Grant Willson: "Resist Materials for Short Wavelength" Bunshin Shuppan Inc., 1988.

Hence, there is now expected to develop a new resist to be employed for photolithography in which ArF excimer laser is to be used. Such a resist used for ArF light exposure is required to enhance cost performance of laser, because a gas from which laser is radiated has short life-time, and also because a laser radiating equipment is expensive. Thus, the resist is expected to have a high resolution as well as a high sensitivity in response to a design rule getting smaller and smaller.

As one of methods of enhancing a sensitivity of resist, there has been well known a chemically amplified resist which utilizes a photo acid generator as a sensitizer. For typical instance, Japanese Patent Publication No. 2-27660 has suggested a resist comprised of a combination of triphenylsulfonium hexafluoroarsenate and poly (p-tert-butoxycarbonyloxy-α-methylstyrene). There are many reports about a chemically amplified resist for use with a KrF excimer laser, for instance, one of which is American Chemical Society Symposium Series, 1984, Vol. 242, pages 11–23, reported by Hiroshi Ito and C. Grant Willson. A chemically amplified resist is characterized by the steps of generating proton acid by exposing a photo acid generator to a light, and transferring the thus generated proton acid through a resist solid phase by means of post-exposure heat treatment to thereby amplify chemical reaction of the resist resin up to hundreds of to thousands of times due to the proton acid in a way like catalytic action. Thus, a quite higher sensitivity can be attained relative to a prior resist which has an optical reaction efficiency, which is defined as a reaction per a photon, of smaller than one (1).

Presently, most of newly developed resists are chemically amplified resists, and hence a chemical amplification system has to be adopted in development of a high sensitive material in response to a wavelength of an exposure light source getting smaller and smaller.

In a conventional lithography in which there is used an exposure light having a longer wavelength than that of KrF excimer laser having a wavelength of 248 nm, a photoresist contains a resin having aromatic rings in a structural unit, such as novolac resin and poly (p-vinylphenol). The dry etching resistance of such aromatic rings gives a dry etching resistance to the above mentioned resin.

However, the aromatic rings quite intensively absorb lights having a wavelength equal to or shorter than 220 nm such as ArF excimer laser having a wavelength of 193 nm, and hence the above mentioned conventional resins cannot be applied to a photolithography in which there is used a light source emitting deep ultraviolet radiation (DUV) having a wavelength equal to or shorter than 220 nm. Thus, there is now studied a resin which does not contain aromatic rings, but has etching resistance, and which contains alicyclic hydrocarbon. However, since alicyclic groups have strong hydrophobic property, the introduction of alicyclic groups causes a resin containing the alicyclic groups to have stronger hydrophobic property, which would cause problems that adhesion of a formed thin film to a silicon substrate is deteriorated, and that the uniformity of a thickness of a film to be formed on a substrate is also deteriorated.

As one of solutions to the problems, there has been suggested the use of methacrylic acid unit. For instance, the inventors have already suggested the copolymer in "Positive Chemically Amplified Resist for ArF Excimer Laser Lithography Composed of a Novel Transparent Photoacid Generator and an Alicyclic Terpolymer", Proceeding of SPIE, Vol. 2438, 1995, pp. 433–444. The copolymer consists of poly (tricyclodecanylacrylate), tetrahydropyranylmethacrylate and methacrylic acid, and is a resin used for a resist into which alicyclic groups and methacrylic acid units are introduced.

Thus, a polymer having transparency to a light having a wavelength of 193 nm and also having a dry-etching resistance can be attained by introduction of alicyclic polymers, and the above mentioned problems of deterioration in adhesion and film thickness uniformity which would be caused by the introduction of alicyclic polymers can be overcome by introduction of methacrylic acid units. The above mentioned methacrylate family resin for composing a resist generally includes tetrahydropyranyl groups and tert-butyl groups as a protective group which is decomposed by acid and changes a polarity of a polymer. For instance, the use of a tetrahydropyranyl group has been reported in K. Nakano, K. Maeda, S. Iwasa, T. Ohfuji and E. Hasegawa: "Positive Chemically Amplified Resist for ArF Excimer Laser Lithography Composed of a Novel Transparent Photoacid Generator and an Alicyclic Terpolymer", Proceeding of SPIE, Vol. 2438, pp. 433–444, and the use of a tert-butyl group has been reported in R. D. Allen, G. M. Wallraff, R. A. Dipietro, D. C. Hofer and R. R. Kunz: "Single Layer Resists with Enhanced Etch Resistance for 193 nm Lithography", Journal of Photopolymer Science and Technology, Vol. 7, No. 3, 1994, pp. 507–516.

However, a tetrahydropyranyl group has shortcomings of a low thermal decomposition point and low thermal stability. In addition, it is known that a tetrahydropyranyl group produces a polymer as a result of side reaction, when used as a protective group for polyvinylphenol, as reported in T. Sakamizu, H. Shiraishi, H. Yamaguchi, T. Ueno and N. Hayashi: "Acid-Catalyzed Reactions of Tetrahydropyranyl-Protected Polyvinylphenol in a Novolak-Resin-Based Positive Resist", Japanese Journal Application Physics, Vol. 31, 1992, pp. 4288–4293.

Similarly, when a tetrahydropyranyl group is used as a protective group for methacrylic acid, there will be formed a polymer as a result of side reaction in a way as shown in the following chemical reaction formula [5]. Namely, a tetrahydropyranyl group has faults as a protective group that it will produce a polymer as a by-product which prevents the resist from being dissolved to a developing agent to thereby deteriorate resolution of the resist, and further thereby produce resist residue or scum.

SUMMARY OF THE INVENTION

In view of the shortcomings of prior photoresists, it is an object of the present invention to provide a photoresist to be used in lithography in which there is used a light source emitting deep ultraviolet radiation having a wavelength equal to or smaller than 220 nm, such as ArF excimer laser, which photoresist provides high resolution and high thermal stability.

It is also an object of the present invention to provide a polymer of which the above mentioned photoresist is made.

It is another object of the present invention to provide a method of patterning a photoresist, which method makes it possible to form a fine resist pattern.

In one aspect, there is provided acrylic acid or methacrylic acid derivative compound represented with the following general formula [1]:

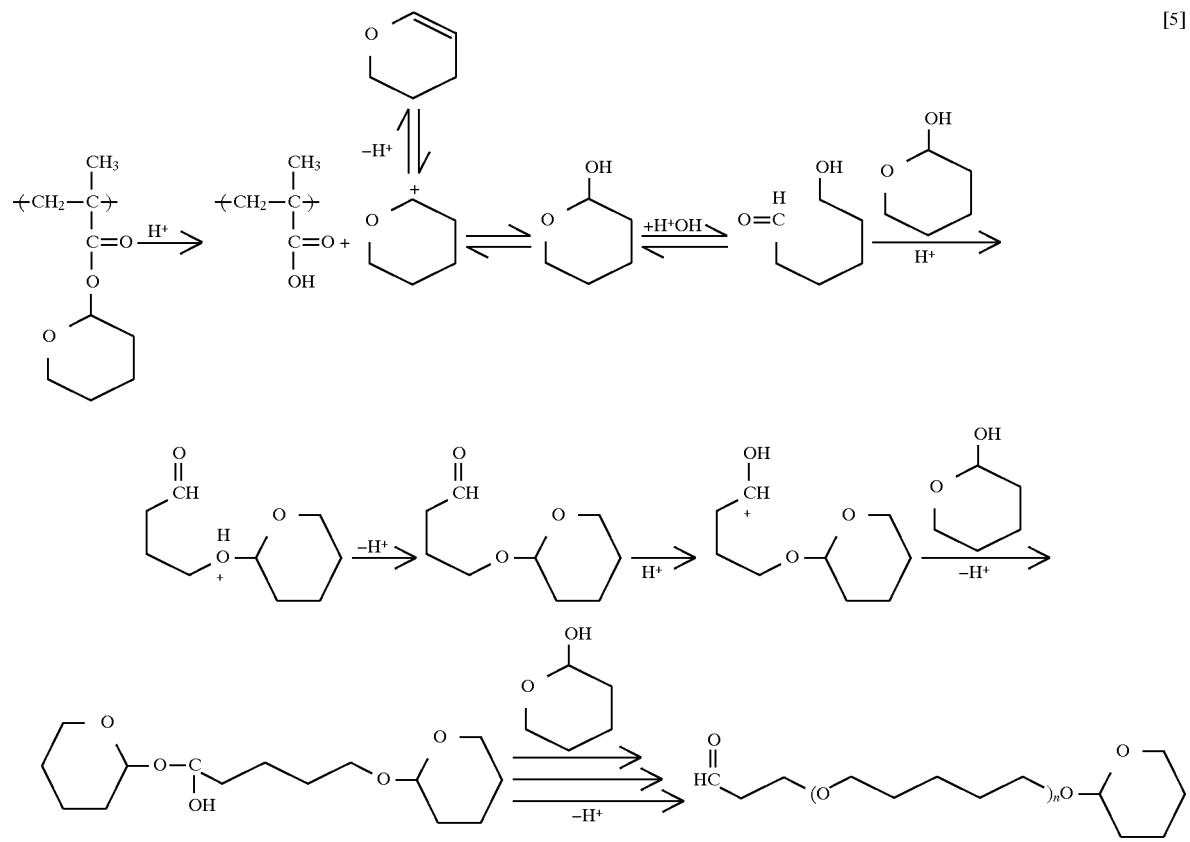

[5]

On the other hand, a tert-butyl group does not proceed desorption quantitatively unless a strong acid such as triphlate acid is used. Hence, a photo acid generator to be used in the photoresist is limited to one which would produce triphlate acid, such as triphenylsulfoniumtrifluoromethanesulfonate. However, if a photo acid generator which produces triphlate acid is to be used for patterning a resist, there will arise a problem that a high resolution cannot be attained because such a photo acid generator would cause a surface of a resist to be difficult to be dissolved.

As discussed above, a resist for lithography employing a light having a wavelength equal to or smaller than 220 nm has the etching resistance and adhesion to a substrate, but does not have protective groups for changing polarity of a resin. Thus, there has been suggested no resists having high resolution and high sensitivity by which a fine pattern can be obtained without production of scum.

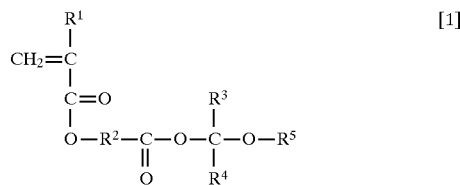

[1]

wherein $R^1$ represents one of a hydrogen atom and a methyl group, $R^2$ represents a divalent hydrocarbon group including a bridged cyclic hydrocarbon group and having a carbon number in the range of 7 to 13 both inclusive, $R^3$ represents one of a hydrogen atom and a hydrocarbon group having a carbon number of 1 or 2, $R^4$ represents a hydrocarbon group having a carbon number of 1 or 2, and $R^5$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive.

The divalent hydrocarbon group represented with $R^2$ includes, for instance, a tricyclo [5. 2. 1. 0$^{2,6}$] decanediyl group, a tricyclo [5. 2. 1. 0$^{2,6}$] decylmethylene group, an adamantanediyl group, a norbornanediyl group, a methylnorbornanediyl group, an isobornanediyl group, a tetracyclo [4. 4. 0. 1$^{2,5}$. 1$^{7,10}$] dodecylmethylene group, a tetracyclo [4. 4. 0. 1$^{2,5}$. 1$^{7,10}$] dodecanediyl group, and a methyltetracyclo [4. 4. 0. 1$^{2,5}$. 1$^{7,10}$] dodecanediyl group, as shown in Table 1. However, the divalent hydrocarbon group $R^2$ is not to be limited to those listed above.

TABLE 1

| $R^2$, $R^7$, $R^9$ | Chemical Structure of Group |
|---|---|
| Tricyclo [5.2.1.0$^{2,6}$] decanediyl Group | |
| Tricyclo [5.2.1.0$^{2,6}$] decylmethylene Group | —CH$_2$— or —CH$_2$— |
| Adamantanediyl Group | |
| Norbornanediyl Group | |
| Methylnorbornanediyl Group | CH$_3$ |
| Isobornanediyl Group | CH$_3$ CH$_3$ CH$_3$ |
| Tetracyclo [4.4.0.1$^{2,5}$.1$^{7,10}$] dodecanediyl Group | |
| Methyltetracyclo [4.4.0.1$^{2,5}$.1$^{7,10}$] dodecanediyl Group | CH$_3$ |

Each of the hydrocarbon groups represented with $R^3$ and $R^4$ is, for instance, a methyl group or an ethyl group.

The hydrocarbon group represented with $R^5$ includes, for instance, a methyl group, an ethyl group, a propyl group, a butyl group, a pentyl group, a hexyl group, a heptyl group, an octyl group, a nonyl group, a decyl group, an undecyl group, a dodecyl group, a cyclopentyl group, a cyclohexyl group, a cycloheptyl group, a norbornyl group, a tricyclodecanyl group, a dicyclopentenyl group, a dicyclopentenyloxyethyl group, a cyclohexyl group, a norbonyl group, a norbornaneepoxy group, a norbornaneepoxymethyl group, an adamantyl group, a methoxyethyl group, an ethoxyethyl group, a propoxyethyl group, a butoxyethyl group, a pentyloxyethyl group, a hexanoxyethyl group, a heptanoxyethyl group, a cycloheptanoxyethyl group, a cyclohexanoxyethyl group, a cyclopentanoxyethyl group, an ocyclohexanoxyethyl group, an octaoxyethyl group, an obutoxyethyl group, an octaoxyethyl group, a methoxypropyl group, an ethoxypropyl group, a propyoxypropyl group and a butoxypropyl group. However, the hydrocarbon group $R^5$ is not to be limited to those listed above.

There is further provided a polymer including a compound represented with the above mentioned general formula [1] within a structural unit thereof.

There is still further provided a polymer represented with the following general formula [2]:

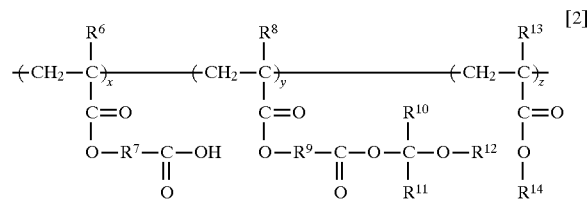

wherein each of $R^6$, $R^8$ and $R^{13}$ represents one of a hydrogen atom and a methyl group, each of $R^7$ and $R^9$ represents a divalent hydrocarbon group including a bridged cyclic hydrocarbon group and having a carbon number in the range of 7 to 13 both inclusive, $R^{10}$ represents one of a hydrogen atom and a hydrocarbon group having a carbon number of 1 or 2, $R^{11}$ represents a hydrocarbon group having a carbon number of 1 or 2, $R^{12}$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive, $R^{14}$ represents one of a hydrogen atom and a hydrocarbon group having a carbon number in the range of 1 to 10 both inclusive, x+y+z=1, x is in the range of 0.1 to 0.9, y is in the range of 0.1 to 0.7, and z is in the range of 0 to 0.7.

For instance, each of the hydrocarbon groups represented with $R^{10}$ and $R^{11}$ is a methyl group or an ethyl group.

The hydrocarbon group represented with $R^{12}$ includes, for instance, a methyl group, an ethyl group, a propyl group, a butyl group, a pentyl group, a hexyl group, a heptyl group, an octyl group, a nonyl group, a decyl group, an undecyl group, a dodecyl group, a cyclopentyl group, a cyclohexyl group, a cycloheptyl group, a norbornyl group, a tricyclodecanyl group, a dicyclopentenyl group, a dicyclopentenyloxyethyl group, a cyclohexyl group, a norbonyl group, a norbornaneepoxy group, a norbornaneepoxymethyl group, an adamantyl group, a methoxyethyl group, an ethoxyethyl group, a propoxyethyl group, a butoxyethyl group, a pentyloxyethyl group, a hexanoxyethyl group, a heptanoxyethyl group, a cycloheptanoxyethyl group, a cyclohexanoxyethyl group, a cyclopentanoxyethyl group, an ocyclohexanoxyethyl group, an octaoxyethyl group, an obutoxyethyl group, an octaoxyethyl group, a methoxypropyl group, an ethoxypropyl group, a propyoxypropyl group and a butoxypropyl group. However, the hydrocarbon group $R^{12}$ is not to be limited to those listed above.

The hydrocarbon group represented with $R^{14}$ includes, for instance, a methyl group, an ethyl group, a propyl group, a butyl group, a pentyl group, a hexyl group, a heptyl group, an octyl group, a nonyl group, a decyl group, a cyclopentyl group, a cyclohexyl group, a cycloheptyl group, and a norbornyl group. However, the hydrocarbon group $R^{14}$ is not to be limited to those listed above.

It is preferable that the above mentioned polymer has a weight average molecular weight in the range of 1,000 to 500,000 both inclusive.

The above mentioned polymers in accordance with the present invention can overcome the earlier discussed problems. In a resin containing the polymer defined by the general formula [1] within a structural unit thereof and a resin containing the polymer defined by the general formula [2], parts represented with the following general formulas [3] and [4] are decomposed by acid to thereby change polarity of the polymer. The parts represented with the general formulas [3] and [4] are decomposed by heated acid into carboxylic acid, alcohol and aldehyde.

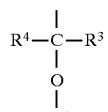

[3]

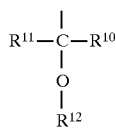

[4]

Since the parts represented with the general formulas [3] and [4] have alkoxy groups which are one of electron donating groups and have small steric hindrance, acid is readily accessible to the parts. Thus, decomposition proceeds more rapidly than conventionally used tetrahydropyranyl group and tert-butyl group. Accordingly, a photoresist made of the polymers in accordance with the present invention makes it possible to carry out resolution with smaller amount of light for exposure than a conventional resin to be used for ArF excimer laser lithography employing a tert-butyl group or a tetrahydropyranyl group.

A tert-butyl group has low desorption reaction efficiency, and hence could not carry out resolution unless there is used a photo acid generator which produces strong acid such as triphlate acid. However, if a photo acid generator which will produce strong acid such as triphlate acid is employed, a photoresist tends to be influenced by the effect of unlikeliness of dissolution of a surface thereof, and hence it is difficult to form a fine pattern. Thus, a surface protection film needs to be formed over a resist.

On the other hand, the photoresist made in accordance with the present invention makes it possible to carry out resolution, even if there is employed a photo acid generator which produces weaker acid than triphlate acid, such as toluenesulfonic acid. In addition, the photoresist made in accordance with the present invention produces no any polymers as by-products unlike a conventional resin employing a tetrahydropyranyl group therein. Thus, the present invention makes it possible to form a fine resist pattern without resist residue or scum.

In another aspect, there is provided a photoresist including a resin composed of a polymer including the compound represented with the general formula [1] within a structural unit thereof, and a photo acid generator.

There is further provided a photoresist including a resin composed of a polymer represented with the general formula [2], and a photo acid generator.

It is preferable that each of the above mentioned resins has a weight percent in the range of 75 to 99.8 both inclusive, and the photo acid generator has a weight percent in the range of 0.2 to 25, and more preferable that each of the resins has a weight percent in the range of 85 to 99 both inclusive, and the photo acid generator has a weight percent in the range of 1 to 15.

In the secondly mentioned photoresist, it is preferable that the polymer represented with the general formula [2] has a weight average molecular weight in the range of 1,000 to 500,000 both inclusive.

In general, a photo acid generator generates an acid when exposed to light. The photo acid generator as a constituent of the photoresist made in accordance with the present invention is one that generates an acid when exposed to light which preferably has a wavelength equal to or less than 400 nm, more preferably in the range of 180 to 220 nm both inclusive. Any photo acid generator may be used for the present invention, if a mixture of the earlier mentioned polymer made in accordance with the invention and the photo acid generator is sufficiently soluble in an organic solvent, and further if it is possible to form a uniform deposition film from the solution by means of a layer forming process such as a spin coating process. One or more photo acid generators may be mixed for use with the invention. As an alternative, the photo acid generator may be used in combination with appropriate photosensitizer(s).

Photo acid generators usable for reducing the present invention into practice may be selected, for instance, from any one of (a) triphenylsulfonium salt derivatives proposed in Journal of the Organic Chemistry, 1978, Vol. 43, No. 15, pp. 3055–3058, by J. V. Crivello et al., (b) onium salts such as sulfonium salt, iodonium salt, phosphonium salt, diazonium salt and ammonium salt, (c) 2,6-dinitrobenzyl ester proposed in SPIE Proceedings, 1990, Vol. 1262, pp. 32–48, by O. Nalamasu et al., (d), 1,2,3-tri (methanesulfonyloxy) benzene proposed in Proceedings of PME '89, 1990, pp 413–424, by Takumi Ueno et al., published through Kodansha, (e) sulfosuccinimide disclosed in Japanese Unexamined Patent Publication No. 5-134416. However, it should be noted that a photo acid generator to be used for the invention is not to be limited to the above mentioned ones (a) to (e).

The most preferable photo acid generators are ones represented with the following general formulas [6] and [7].

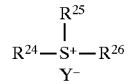

[6]

In the formula [6], each of $R^{24}$ and $R^{25}$ represents one of straight-chain, branch-type and cyclic alkyl groups, and $R^{26}$ represents one of (a) a straight-chain, branch-type or cyclic alkyl group, (b) a 2-oxo cyclic alkyl group, (c) a 2-oxo straight-chain alkyl group, and (d) a 2-oxo branch-type alkyl group, and Y- represents ion pairs such as $BF_4^-$, $AsF_6^-$, $SbF_6^-$, $PF_6^-$, $CF_3COO^-$, $ClO_4^-$, and $CF_3SO_3^-$.

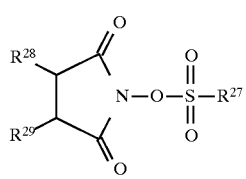

In the formula [7], $R^{27}$ represents one of (a) a straight-chain, branch-type or cyclic alkyl group, (b) a replaced aromatic ring, and (c) a non-replaced aromatic ring, and each of $R^{28}$ and $R^{29}$ represents one of (a) a straight-chain, branch-type or cyclic alkyl group and (b) a straight-chain, branch-type or cyclic haloalkyl group.

A photo acid generator presently, widely used for KrF excimer laser lithography, such as triphenylsulfonium trifluoromethanesulfonate (hereinafter, referred to simply as "TPS"), has a quite strong light-absorbing property for deep ultraviolet radiation (DUV) having a wavelength equal to or smaller than 220 nm, and hence it is required to limit an amount thereof, if it is to be used as a photo acid generator in the present invention. Now comparing a transmissivity at a wavelength of 193.4 nm which is a main wavelength of ArF excimer laser beam, a transmissivity of a deposition film having a thickness of 1 μm and composed of polymethylmethacrylate containing TPS at 1.5 wt % on the basis of a total weight of the film was about 50%, and a transmissivity of a film having a thickness of 1 μm and composed of polymethylacrylate containing TPS at 5. 5 wt % was about 6%. On the other hand, a transmissivity of a polymethylmethacrylate deposition film containing therein, for instance, cyclohexylmethyl(2-oxocyclohexyl) sulfoniumtrifluoromethanesulfonate, which is one of sulfonium salt derivatives represented with the general formula [6], was 71% when the film contained the above mentioned compound at 5 wt %, and was 55% at 30 wt %, both of which are higher than the formerly mentioned transmissivity. A transmissivity of a deposition film containing therein, for instance, N-hydroxysuccinimidetrifluoromethanesulfonate, which is one of photo acid generators represented with the general formula [7], was about 50%, when the film contained the above mentioned compound at 5 wt %.

As discussed above, any of the photo acid generators represented with the general formulas [6] and [7] absorbs quite little amount of light in the band of DUV having a wavelength ranging from 185.5 nm to 220 nm, and accordingly it is obvious that they are preferable for a constituent of a resist to be used for ArF excimer laser lithography in terms of transparency to an exposure light. Specifically, a photo acid generator to be used for the photoresist made in accordance with the present invention may be selected from any one of (a) 2-oxocyclohexylmethyl(2-norbornyl) sulfoniumtrifluoromethanesulfonate,
(b) cyclohexylmethyl(2-oxocyclohexyl) sulfoniumtrifluoromethanesulfonate,
(c) dicyclohexyl(2-oxocyclohexyl) sulfoniumtrifluoromethanesufonate,
(d) dicyclohexylsulfonylcyclohexanone,
(e) dimethyl(2-oxocyclohexyl) sulfoniumtrifluoromethanesulfonate,
(f) triphenylsulfoniumtrifluoromethanesulfonate,
(g) diphenyliodoniumtrifluoromethanesulfonate,
(h) N-hydroxysuccinimidetrifluoromethanesulfonate, and
(i) N-hydroxysuccinimidetoluenesulfonate.
However, it should be noted that a photo acid generator to be used for the present invention is not to be limited to those, and any other photo acid generator may be selected.

A single kind of or a plurality of kinds of photo acid generator(s) may be used in the photoresist made in accordance with the present invention. The photo acid generator is contained by weight percent preferably in the range from 0.2 to 25 both inclusive, and more preferably in the range from 1 to 15 both inclusive, provided that all constituents containing the photo acid generator constitute 100 wt %. If a content rate of the photo acid generator would be lower than 0.2 wt %, the photoresist could have only quite a small sensitivity, and hence the formation of a pattern would become difficult. On the other hand, if a content rate of the photo acid generator would be higher than 25 wt %, it would be difficult to form a uniform deposition layer, and further there would arise a problem that scum tends to be generated after development of a pattern. A content rate of the polymer is preferably in the range from 75 to 99.8 wt %, and more preferably in the range from 85 to 99 wt % on the basis of the 100 wt % of all constituents including the polymer itself.

Any organic solvent may be used for the photoresist made in accordance with the present invention, if the polymer and photo acid generator would be sufficiently soluble in a solvent, and further if it would be possible to form a uniform deposition layer from the solution by means of a method such as a spin coating process. A single kind of solvent or a plurality of kinds of solvents in combination may be used.

Specifically, a solvent to be used for the photoresist made in accordance with the present invention is selected from any one of n-propyl alcohol, isopropyl alcohol, n-butyl alcohol, tert-butyl alcohol, methylcellosolve acetate, ethylcellosolve acetate, propyleneglycol monoethylether acetate, methyl lactate, ethyl lactate, 2-methoxybutyl acetate, 2-ethoxyethyl acetate, pyrubic acid methyl, pyrubic acid ethyl, 3-methoxypropionatemethyl, 3-methoxypropionateethyl, N-methyl-2-pyrrolidinone, cyclohexanone, cyclopentanone, cyclohexanol, methylethylketone, 1,4-dioxan, ethyleneglycolmonomethylether, ethyleneglycolmonomethylether acetate, ethyleneglycolmonoethylether, ethyleneglycolmonoisopropylether, diethyleneglycolmonomethylether, and diethyleneglycoldimethylether. It should be noted that a solvent to be used for the photoresist is not to be limited to the above mentioned ones, but other solvents may be selected.

As would be obvious to those skilled in the art, essential constituents of the photoresist to be made in accordance with the present invention are the above mentioned polymer, photo acid generator, and solvent. However, the photoresist may include other constituents such as agent for preventing dissolution, surfactant, pigment, stabilizer, reagent for enhancing application property, and dye.

As will be obvious in view of the later mentioned preferred embodiments, a resin of which the inventive photoresist is made is thermally, highly stable. In addition, the inventors conducted an experiment for resolution by using ArF excimer laser as an exposure light, and confirmed that the photoresist in accordance with the present invention made it possible to form a rectangular, fine pattern with high sensitivity without resist residue or scum.

That is, the photoresist made in accordance with the present invention is suitable for the formation of a fine pattern in lithography in which there is employed DUV having a wavelength equal to or smaller than 220 nm as an exposure light.

In still another aspect, there is provided a method of patterning a photoresist, including the steps of (a) applying a photoresist on a substrate, (b) exposing the photoresist to a light having a wavelength smaller than 400 nanometers, and (c) developing the photoresist to thereby form a resist pattern. Herein, the photoresist includes (a) a resin composed of a polymer including a compound represented with the above mentioned general formula [1] within a structural unit thereof, and (b) a photo acid generator such as the above mentioned one.

It is preferable that the light has a wavelength in the range of 180 nanometers to 220 nanometers. It is preferable to use ArF excimer laser as the light.

There is further provided a method of patterning a photoresist, including the steps of (a) applying a photoresist on a substrate, (b) exposing the photoresist to a light having a wavelength smaller than 400 nanometers, and (c) developing the photoresist to thereby form a resist pattern. Herein, the photoresist includes a resin composed of a polymer represented with the above mentioned general formula [2], and a photo acid generator such as the above mentioned one.

It is preferable that the polymer has a weight average molecular weight in the range of 1,000 to 500,000 both inclusive.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
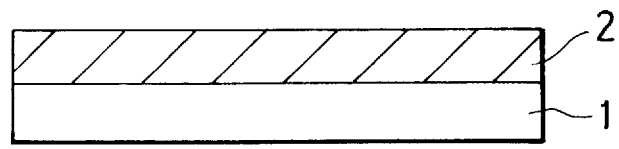
FIGS. 1 to 3 are cross-sectional views of a wafer for showing steps of a method of forming a positive pattern on the wafer by using the photoresist made in accordance with the present invention.

Preferred embodiments in accordance with the present invention will be explained hereinbelow.

[SYNTHESIS EXAMPLE 1]

Synthesis of Carboxytricyclodecylmethyl Methacrylate represented with the formula [9]

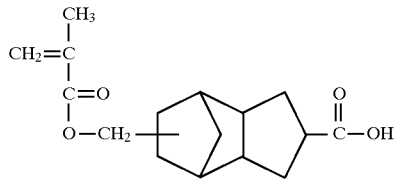
[9]

Followings were put into 500 ml flask having four inlets and equipped with a calcium chloride (CaCl$_2$) drying tube, an isotactic dropping funnel and a thermometer:

(a) 50 grams (0.25 mols) of tricyclo [5. 2. 1. 0$^{2,6}$] decane-4,8-dimethanol;

(b) 25.8 grams (0.25 mols) of dry pyridine; and (c) 300 ml of dry tetrahydrofuran.

The mixture of (a) to (c) was stirred so that it became uniform solution, and then cooled in ice bath. While the solution was being intensively stirred with a teflon bar, a solution of 26.5 grams (0.25 mols) of methacryloyl chloride into which 100 ml of dry tetrahydrofuran had been dissolved was slowly dropped into the solution through a dropping funnel. After the dropping was completed, the resultant solution was stirred in ice bath for an hour, and then was stood for reaction at room temperature (RT) for ten hours.

After the precipitate was filtered away from the solution, the solvent was removed out of the filtrate under reduced pressure. Then, the residue was dissolved into 500 ml of methylene chloride. Then, this solution in which the residue was dissolved was disposed with 0.5N HCl, saturated salt aqueous solution, 3% sodium bicarbonate aqueous solution and again saturated salt aqueous solution in this order. The resultant methylene chloride layer was dehydrated with magnesium sulfate, and then was filtered. The residue which was obtained by removing the solvent by means of an evaporator was refined through a silica gel column by using a mixture solvent of hexane and ethyl acetate. As a result, there was obtained 29.6 grams of tricyclo [5. 2. 1. 0$^{2,6}$] decane-4,8-dimethanolmonomethacrylate in the form of viscous liquid. The yield was 44%.

Then, followings were put into 100 ml flask having four inlets and equipped with a calcium chloride (CaCl$_2$) drying tube, an isotactic dropping funnel and a thermometer:

(a) 24.9 grams (66.2 mmols) of pyrdinium dichromate; and (b) 40 ml of N,N-dimethylformamide.

The mixture of (a) and (b) was stirred so that it became uniform solution. Then, a solution of 10 ml of N,N-dimethylformamide in which 5 grams (18.9 mmols) of tricyclo[5. 2. 1. 0$^{2,6}$] decane-4,8-dimethanolmonomethacrylate had been dissolved was dropped into the solution. After the dropping was completed, the resultant solution was stood for reaction at room temperature (RT) for ten hours. The resultant solution was diluted with 500 ml of water, and then an organic layer was extracted with diethylether. A resultant ether layer was dehydrated with magnesium sulfate, and then was filtered out. The residue obtained by removing the solvent by means of an evaporator was refined through a silica gel column by using a mixture solvent of hexane and ethyl acetate. As a result, there was obtained 2.12 grams of the target material represented with the general formula [9] in the form of viscous liquid. The yield was 40%.

Elemental Analysis Value (Weight %) C: 69.4 (69.0) H: 8.3 (8.0)

The figures in parentheses indicate values calculated with C$_{16}$H$_{22}$O$_4$ whose MW is 278.35.

IR(cm$^{-1}$): 2400–3350 ($v_{OH}$), 2950 ($v_{C-H}$), 1696 ($v_{C=O}$), 1626 ($v_{C=C}$), 1166 ($v_{C-O}$)

$^1$H-NMR (CDCl$_3$, internal standard material: tetramethylsilane) ppm: 0.95–2.74 (m, 14H), 1.95 (s, 3H), 3.88–4.17 (m, 2H), 5.55 (d, 1H), 6.1 (s, 1H), 9.58–10.8 (s, 1H)

[SYNTHESIS EXAMPLE 2]

Synthesis of Carboxytetracyclododecyl Methacrylate represented with the formula [10]

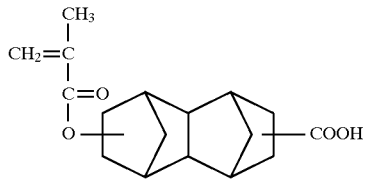
[10]

200 grams of dicyclopentadiene was put into a 500-ml flask equipped with a distillatory, and then was heated for reflux at 180° C. Then, about 100 grams of cyclopentadiene cracked at about 40° C. was dropped into 200 grams of t-butylacrylate with being cooled with ice bath. The resultant solution was stirred over a night. The resultant mixture was distilled under reduced pressure (66°–67° C./1 mmHg). As a result, there was obtained 296 grams of norbornenecarboxylic acid t-butylester. The yield was 98%.

Then, 238 grams (1.224 mols) of norbornenecarboxylic acid t-butylester, 162 grams (1.224 mols) of dicyclopentadiene, and 0.4 grams of methylhydrodoquinone were reacted with one another at 180° C. for seven hours. The resultant mixture was distilled under reduced pressure at 100°–116° C./1 mmHg, and then separated by means of a column using hexane as a solvent. As a result, there was obtained tetracyclododecenecarboxylic acid t-butylester by 60 grams. The yield was 19%.

Then, the thus obtained 60 grams of tetracyclododecenecarboxylic acid t-butylester and 150 ml of dry THF were put into 200-ml flask having four inlets, and were cooled at 0° C. Under argon (Ar) atmosphere, 120 ml solution of 1M Volan-THF complex salt THF was dropped into the 200-ml flask. The mixture in the 200-ml flask was stirred at 0° C. for an hour, and then stirred at room temperature for another hour. Then, the mixture was cooled down to 0° C. Then, 18 ml of water was dropped into the mixture, and further 40 ml of aqueous sodium hydroxide and 25 ml of 30% hydrogen peroxide were dropped into the mixture at 20° C. or lower. After the mixture had been stirred at room temperature for 1.5 hours, a water layer was saturated with sodium chloride and further diluted with 500 ml of ether. After an ether layer was washed with saturated brine and water, and dried with magnesium sulfate. Then, ether was removed. Thus, there was obtained hydroxytetracyclododecanecarboxylic acid t-butylester by 60 grams. The yield was 94%.

A mixture of 46.2 grams (0.166 mols) of the thus obtained hydroxytetracyclododecanecarboxylic acid t-butylester and 13.2 grams (0.166 mols) of pyridine was dissolved in 120 ml of dry tetrahydrofuran. After the solution was cooled at 0° C., a solution of 60 ml tetrahydrofuran containing 19.4 grams (0.166 mols) of methacrylic acid chloride was dropped into the solution. The resultant solution was stirred for an hour, and stood for reaction at room temperature over a night. After precipitated pyridine salt acid salt was filtered away, filtrate was condensed and then diluted with 200 ml of methylene chloride. Then, the resultant was cleansed with 5% HCl aqueous solution, 3% NaCO$_3$ solution, and saturated brine in this order, and was dried with magnesium sulfate. Methylene chloride was removed under reduced pressure, and the residue obtained by removing methylene chloride was refined through a silica gel column by using a mixture solvent of hexane and ethyl acetate. As a result, there was obtained 27 grams of tert-butoxycarbonyl [4. 4. 0. 1$^{2,5}$ 1$^{7,10}$] dodecylmethacrylate. The yield was 47%.

The thus obtained tert-butoxycarbonyl [4. 4. 0. 1$^{2,5}$ 1$^{7,10}$] dodecylmethacrylate was dissolved by 18 grams into 120 ml of toluene. Then, ten drops of trifluoromethanesulfonic acid was added into the resultant solution, which was then stirred at room temperature for 5 hours. After a toluene layer had been washed with saturated brine, an organic layer was extracted with ether. The thus extracted organic layer was washed with saturated brine and water, and then dried with magnesium sulfate. The dried organic layer was refined through a silica gel column by using a mixture solvent of hexane and ethyl acetate. As a result, there was obtained 10.2 grams of the target material. The yield was 67%.

IR(cm$^{-1}$): 2400–3350 ($v_{O-H}$), 3048, 2960 ($v_{C-H}$), 1710 ($v_{C=O}$), 1700 ($v_{C=O}$), 1632 ($v_{C=C}$), 1170 ($v_{C-O}$)

[SYNTHESIS EXAMPLE 3]

Synthesis of Carboxymethyltetracyclododecyl Methacrylate represented with the formula [11]

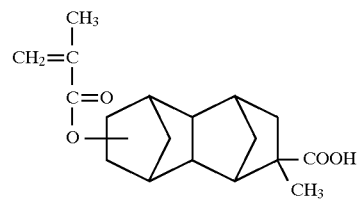

In the same way as the synthesis example 2, synthesis was performed using tert-butylmethacrylate in place of tert-butylacrylate. As a result, there was obtained 7.2 grams of a target material represented with the general formula [11].

IR(cm$^{-1}$): 2400–3400 ($v_{O-H}$), 3048, 2960 ($v_{C-H}$), 1710 ($v_{C=O}$), 1700 ($v_{C=O}$), 1632 ($v_{C=C}$), 1170 ($v_{C-O}$)

[SYNTHESIS EXAMPLE 4]

Synthesis of Carboxymethyltetracyclododecyl Acrylate represented with the formula [12]

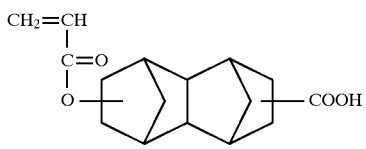

In the same way as the synthesis example 2, synthesis was performed using acrylic acid chloride in place of methacrylic acid chloride. As a result, there was obtained 7.8 grams of a target material represented with the general formula [12].

IR(cm$^{-1}$): 2400–3350 ($v_{O-H}$), 3050, 2950 ($v_{C-H}$), 1710 ($v_{C=O}$), 1700 ($v_{C=O}$), 1630 ($v_{C=C}$), 1168 ($v_{C-O}$)

[Embodiment 1]

Synthesis of Ethoxyethoxycarbonyltricyclodecylmethylmethacrylate represented with the formula [13]

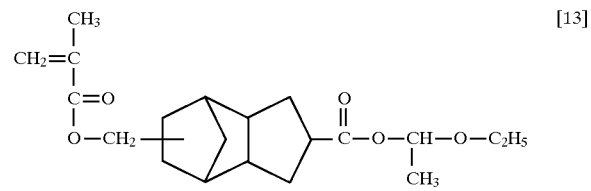

Herein, ethoxyethoxycarbonyltricyclodecylmethylmethacrylate is a compound represented with the general formula [1] where R$^1$=CH$_3$, R$^2$=a tricyclodecylmethylene group (C$_{11}$H$_{17}$), R$^3$=H, R$^4$=CH$_3$, and R$^5$=C$_2$H$_5$.

Followings were put into 200-ml flask having three inlets and equipped with a calcium chloride (CaCl$_2$) drying tube and a thermometer:

(a) 6 grams (0.022 mols) of the compound having been obtained in the synthesis example 1;

(b) 1.30 grams (0.022 mols) of vinylethylether; and (c) 60 ml of methylene chloride.

The mixture was cooled with ice. Into the mixture was added 15 mg of p-toluenesulfonic acid pyridine salt, and the resultant solution was stirred for an hour. After the reaction was completed, the mixture was diluted with 120 ml of diethylether, and then washed with 2.5% aqueous sodium hydroxide twice and saturated brine once. The resultant organic layer was dehydrated with magnesium sulfate, and then filtered out. By using an evaporator, the solvent was removed, thereby there was obtained 7 grams of the target material in the form of viscous liquid. The yield was 96%.

Elemental Analysis Value (Weight %) C: 68.9 (68.5) H: 8.9 (8.6)

The figures in parentheses indicate calculation values calculated with $C_{20}H_{30}O_5$ whose MW is 350.454.

IR($cm^{-1}$): 2950, 2872 ($v_{C-H}$), 1720 ($v_{C=O}$), 1630 ($v_{C=C}$), 1166 ($v_{C-O}$)

$^1$H-NMR (CDCl$_3$, internal standard material: tetramethylsilane) ppm: 1.0–2.7 (m, 14H), 1.2 (s, 3H), 1.45- (d, 3H), 1.95 (s, 3H), 3.75 (q, 2H), 3.8–4.1 (m, 2H), 5.55 (s, 1H), 5.9 (q, 1H), 6.1 (s, 1H)

[Embodiment 2]

Synthesis of Butoxyethoxycarbonyltricyclo-decylmethylmethacrylate represented with the general formula [14]

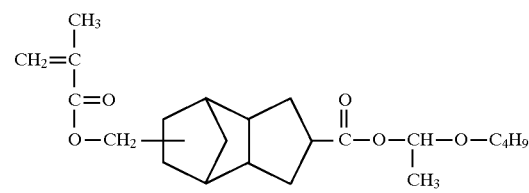

[14]

Herein, butoxyethoxycarbonyltricyclo-decylmethylmethacrylate is a compound represented with the general formula [1] where $R^1=CH_3$, $R^2=$a tricyclodecyl-methylene group ($C_{11}H_{17}$), $R^3=H$, $R^4=CH_3$, and $R^5=C_4H_9$.

In the same way as the embodiment 1, synthesis was carried out using 2.2 grams (0.022 mols) of butylvinylether in place of vinylethylether. The target material was obtained by 7.9 grams. The yield was 97%.

Elemental Analysis Value (Weight %) C: 69.5 (69.8) H: 8.7 (9.1)

The figures in parentheses indicate calculation values calculated with $C_{22}H_{34}O_5$ whose MW is 378.51.

IR($cm^{-1}$): 2950, 2872 ($v_{C-H}$), 1720 ($v_{C=O}$), 1630 ($v_{C=C}$), 1660 ($v_{C-O}$)

[Embodiment 3]

Synthesis of Methoxyethoxycarbonyltricy-clodecylmethylmethacrylate represented with the general formula [15]

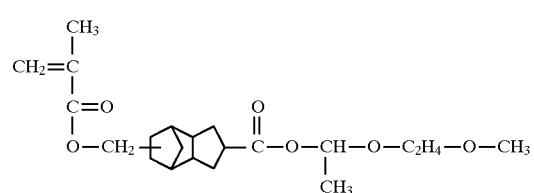

[15]

Herein, methoxyethoxycarbonyltricy-clodecylmethylmethacrylate is a compound represented with the general formula [1] where $R^1=CH_3$, $R^2=$a tricyclo-decylmethylene group ($C_{11}H_{17}$), $R^3=H$, $R^4=CH_3$, and $R^5=CH_3OC_2H_4$.

In the same way as the embodiment 1, synthesis was carried out using 2.25 grams (0.022 mols) of methoxyvi-nylether in place of vinylethylether. The target material was obtained by 7.9 grams. The yield was 96%.

IR($cm^{-1}$): 2950, 2872 ($v_{C-H}$), 1720 ($v_{C=O}$), 1630 ($v_{C=C}$), 1166 ($v_{C-O}$)

[Embodiment 4]

Synthesis of Ethoxyethoxycarbonyltetracy-clododecylmethacrylate represented with the general formula [16]

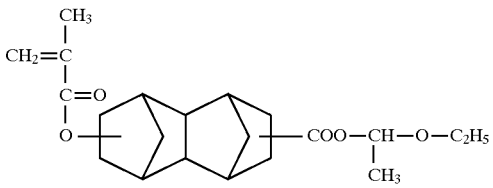

[16]

Herein, ethoxyethoxycarbonyltetracy-clododecylmethacrylate is a compound represented with the general formula [1] where $R^1=CH_3$, $R^2=$a tetracyclodode-canediyl group ($C_{12}H_{16}$), $R^3=H$, $R^4=CH_3$, and $R^5=C_2H_5$.

In the same way as the embodiment 1, synthesis was carried out using the compound obtained in the synthesis example 2 in place of the compound obtained in the synthesis example 1. As a result, the target material was obtained by 7.05 grams in the form of viscous liquid. The yield was 97%.

IR($cm^{-1}$): 2400–3400 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 5]

Synthesis of Cyclohexyloxyethoxycarbonyl-tetracyclo [4. 4. 0. $1^{2,5}$ $1^{7,10}$] dodecyl methacrylate represented with the general formula [17]

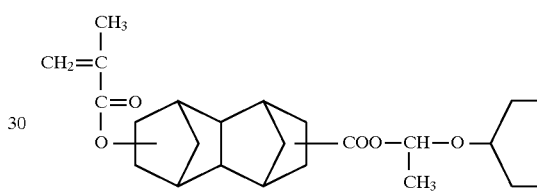

[17]

Herein, cyclohexyloxyethoxycarbonyl-tetracyclo [4. 4. 0. $1^{2,5}$ $1^{7,10}$] dodecyl methacrylate is a compound represented with the general formula [1] where $R^1=CH_3$, $R^2=$a tetracy-clododecanediyl group ($C_{12}H_{16}$), $R^3=H$, $R^4=CH_3$, and $R^5=$a cyclohexyl group ($C_6H_{11}$).

In the same way as the embodiment 1, synthesis was carried out using the compound obtained in the synthesis example 2 in place of the compound obtained in the synthesis example 1, and further using 2.2 grams (0.022 mols) of cyclohexylvinylether in place of ethylvinylether. As a result, the target material was obtained by 8.34 grams in the form of viscous liquid. The yield was 97%.

IR($cm^{-1}$): 2400–3400 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 6]

Synthesis of Methoxyethoxyethoxyethoxycarbonyl-tetracyclo [4. 4. 0. $1^{2,5}$ $1^{7,10}$] dodecyl methacrylate represented with the general formula [18]

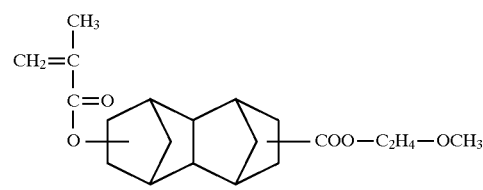

[18]

Herein, methoxyethoxyethoxyethoxycarbonyl-tetracyclo [4. 4. 0. $1^{2,5}$ $1^{7,10}$] dodecyl methacrylate is a compound represented with the general formula [1] where $R^1=CH_3$, $R^2=$a tetracyclododecanediyl group ($C_{12}H_{16}$), $R^3=H$, $R^4=CH_3$, and $R^5=$a methoxyethyl group ($CH_3OC_2H_4$).

In the same way as the embodiment 1, synthesis was carried out using the compound obtained in the synthesis example 2 in place of the compound obtained in the synthesis example 1, and further using 2.2 grams (0.022 mols) of methoxyethylvinylether in place of ethylvinylether. As a result, the target material was obtained by 7.9 grams. The yield was 96%.

IR(cm$^{-1}$): 2400–3400 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 7]

Synthesis of Acetoxyethoxyethoxyethoxycarbonyl-tetracyclo [4. 4. 0. 1$^{2,5}$ 1$^{7,10}$] dodecyl methacrylate represented with the general formula [19]

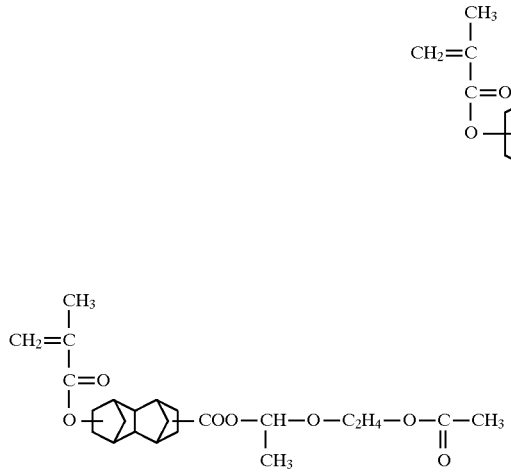

[19]

Herein, acetoxyethoxyethoxyethoxycarbonyl-tetracyclo [4. 4. 0. 1$^{2,5}$ 1$^{7,10}$] dodecyl methacrylate is a compound represented with the general formula [1] where R$^1$=CH$_3$, R$^2$=a tetracyclododecanediyl group (C$_{12}$H$_{16}$), R$^3$=H, R$^4$=CH$_3$, and R$^5$=an acetoxyethyl group (CH$_3$COOC$_2$H$_4$).

In the same way as the embodiment 1, synthesis was carried out using the compound obtained in the synthesis example 2 in place of the compound obtained in the synthesis example 1, and further using 2.2 grams (0.022 mols) of acetoxyethylvinylether in place of ethylvinylether. As a result, the target material was obtained by 8.7 grams. The yield was 98%.

IR(cm$^{-1}$): 2400–3400 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 8]

Synthesis of Adamantyloxyethoxyethoxycarbonyl-tetracyclo [4. 4. 0. 1$^{2,5}$ 1$^{7,10}$] dodecyl methacrylate represented with the general formula [20]

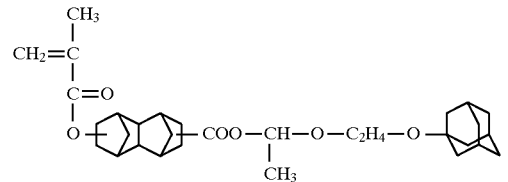

[20]

Herein, adamantyloxyethoxyethoxycarbonyl-tetracyclo [4. 4. 0. 1$^{2,5}$ 1$^{7,10}$] dodecyl methacrylate is a compound represented with the general formula [1] where R$^1$=CH$_3$, R$^2$=a tetracyclododecanediyl group (C$_{12}$H$_{16}$), R$^3$=H, R$^4$=CH$_3$, and R$^5$=an adamantyloxyethyl group (C$_{10}$H$_{15}$OC$_2$H$_4$).

In the same way as the embodiment 1, synthesis was carried out using the compound obtained in the synthesis example 2 in place of the compound obtained in the synthesis example 1, and further using 7.8 grams (0.022 mols) of adamantyloxyethylvinylether in place of ethylvinylether. As a result, the target material was obtained by 8.7 grams in the form of viscous liquid. The yield was 98%.

IR(cm$^{-1}$): 2400–3350 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 9]

Synthesis of Adamantylcarbonyloxyethoxyethoxycarbonyl-tetracyclo [4. 4. 0. 1$^{2,5}$ 1$^{7,10}$] dodecyl methacrylate represented with the general formula [21]

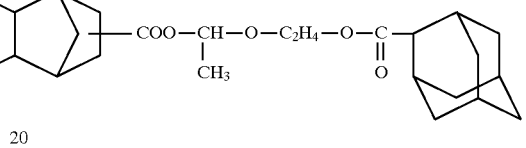

[21]

Herein, adamantylcarbonyloxyethoxyethoxycarbonyl-tetracyclo [4. 4. 0. 1$^{2,5}$ 1$^{7,10}$] dodecyl methacrylate is a compound represented with the general formula [1] where R$^1$=CH$_3$, R$^2$=a tetracyclododecanediyl group (C$_{12}$H$_{16}$), R$^3$=H, R$^4$=CH$_3$, and R$^5$=an adamantylcarbonyloxyethyl group (C$_{10}$H$_{15}$COOC$_2$H$_4$).

In the same way as the embodiment 1, synthesis was carried out using the compound obtained in the synthesis example 2 in place of the compound obtained in the synthesis example 1, and further using 8 grams (0.022 mols) of adamantylcarbonyloxyethylvinylether in place of ethylvinylether. As a result, the target material was obtained by 13.67 grams in the form of viscous liquid. The yield was 90%.

IR(cm$^{-1}$): 2400–3350 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 10]

Synthesis of Ethoxyethoxycarbonylmethyl-tetracyclo [4. 4. 0. 1$^{2,5}$ 1$^{7,10}$] dodecyl methacrylate represented with the general formula [22]

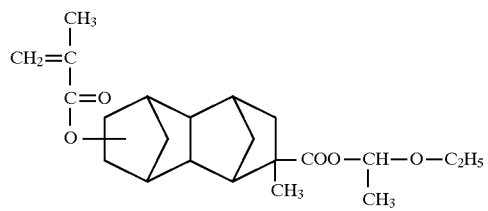

[22]

Herein, ethoxyethoxycarbonylmethyl-tetracyclo [4. 4. 0. 1$^{2,5}$ 1$^{7,10}$] dodecyl methacrylate is a compound represented with the general formula [1] where R$^1$=CH$_3$, R$^2$=a methyltetradodecane group (C$_{13}$H$_{19}$), R$^3$=H, R$^4$=CH$_3$, and R$^5$=C$_2$H$_5$.

In the same way as the embodiment 1, synthesis was carried out using the compound obtained in the synthesis example 3 in place of the compound obtained in the synthesis example. As a result, the target material was obtained by 7.67 grams in the form of viscous liquid. The yield was 96%.

IR(cm$^{-1}$): 2400–3350 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 11]

Synthesis of Ethoxyethoxycarbonyl-methyltetracyclo [4. 4. 0. 1$^{2,5}$ 1$^{7,10}$] dodecyl methacrylate represented with the general formula [23]

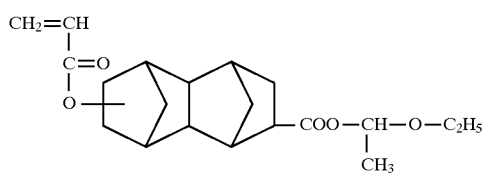

[23]

Herein, ethoxyethoxycarbonyl-methyltetracyclo [4. 4. 0. $1^{2,5}\ 1^{7,10}$] dodecyl methacrylate is a compound represented with the general formula [1] where $R^1$=H, $R^2$=a tetracyclododecanediyl group ($C_{12}H_{16}$), $R^3$=H, $R^4$=$CH_3$, and $R^5$=$C_2H_5$.

In the same way as the embodiment 1, synthesis was carried out using the compound obtained in the synthesis example 3 in place of the compound obtained in the synthesis example 1. As a result, the target material was obtained by 7.3 grams in the form of viscous liquid. The yield was 94%.

IR(cm$^{-1}$): 2400–3350 ($v_{O-H}$), 3048, 2960 ($v_{C-H}$), 1710 ($v_{C=O}$), 1700 ($v_{C=O}$), 1630 ($v_{C=C}$), 1170 ($v_{C-O}$)

[Embodiment 12]

Synthesis of Poly(carboxytricyclododecylmethacrylate-coethoxyethoxycarbonyltricyclododecylmethacrylate represented with the general formula [24]

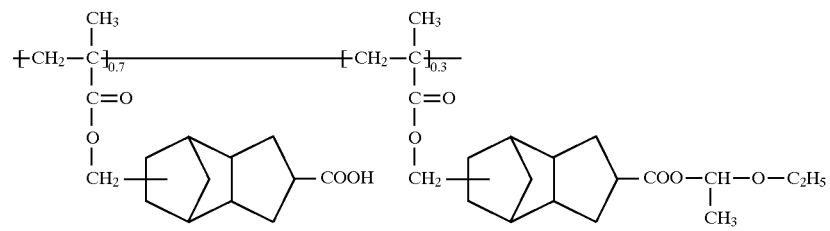

[24]

Herein, poly(carboxytricyclododecylmethacrylate-coethoxyethoxycarbonyltricyclododecylmethacrylate is a compound represented with the general formula [2] where $R^6$=$CH_3$, $R^7$=a tricyclodecylmethylene group ($C_{11}H_{17}$), $R^8$=$CH_3$, $R^9$=a tricyclodecylmethylene group ($C_{11}H_{17}$), $R^{10}$=H, $R^{11}$=$CH_3$, $R^{12}$=$C_2H_5$, x=0.7, y=0.3, and z=0.

In 100-ml egg-plant shaped flask having a reflux cooler equipped with a calcium chloride (CaCl$_2$) tube, 13.9 grams (0.05 mols) of the compound obtained in the synthesis example 1 and 7.36 grams (0.021 mols) of the compound obtained in the embodiment 1 were dissolved in 80 ml of dry tetrahydrofuran, and then 640 mg (39 mmols) of azobisisobutyronitrile (hereinafter, referred to simply as AIBN), a polymerization initiator, was further added thereinto. Then, the mixture was stirred at the temperature in the range of 60° C. to 65° C. for two hours, and then cooled down. Then, the resultant mixture was introduced into 600 ml of ligroin. The precipitated deposit was filtered out. Another reprecipitation refining was carried out, thereby there was obtained 12.5 grams of the target material. The yield was 59%. A copolymerization ratio in the above mentioned copolymerization was 7:3, calculating from an integration ratio of $^1$H-NMR.

Weight-Average Molecular Weight (polystyrene equivalent molecular weight)=28,000, Degree of Dispersion=2.25

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 13]

Synthesis of Poly(carboxytricyclododecylmethylmethacrylate-cobutoxyethoxycarbonyltricyclododecylmethyl methacrylate represented with the general formula [25]

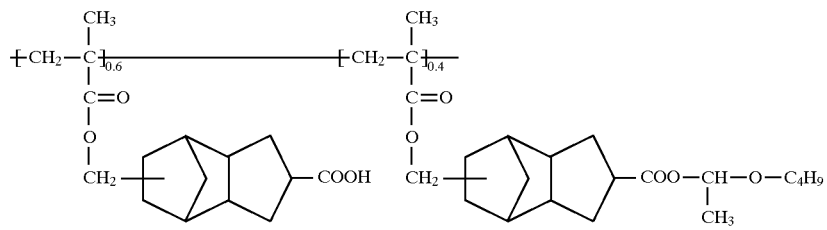

[25]

Herein, poly(carboxytricyclododecylmethylmethacrylate-cobutoxyethoxycarbonyltricyclododecylmethyl methacrylate is a compound represented with the general formula [2] where $R^6$=$CH_3$, $R^7$=a tricyclodecylmethylene group ($C_{11}H_{17}$), $R^8$=$CH_3$, $R^9$=a tricyclodecylmethylene group ($C_{11}H_{17}$), $R^{10}$=H, $R^{11}$=$C_2H_5$, $R^{12}$=$C_4H_9$, x=0.6, y=0.4, and z=0.

In the same way as the embodiment 12, synthesis was carried out using the compound obtained in the embodiment 2 in place of the compound obtained in the embodiment 1 and setting a mol ratio of the monomers to be 6:4. A copolymerization ratio of the obtained polymer was 6:4, calculating from an integration ratio of $^1$H-NMR.

Weight-Average Molecular Weight (polystyrene equivalent molecular weight)=28,800, Degree of Dispersion=2.3

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 14]

Synthesis of Poly(carboxytricyclododecylmethylmethacrylate-comethoxyethoxyethoxycarbonyltricyclododecylmethyl methacrylate represented with the general formula [26]

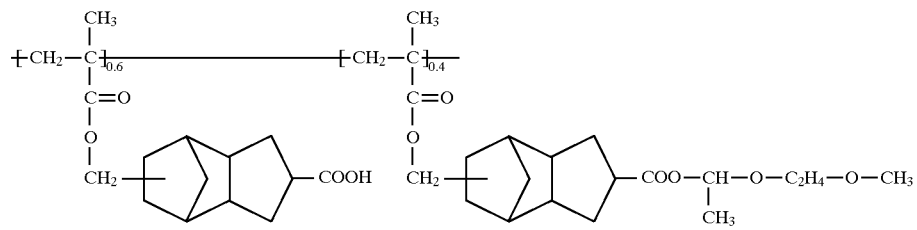

[26]

The target material, poly(carboxytricyclododecylmethylmethacrylate-comethoxyethoxyethoxycarbonyltricyclododecylmethyl methacrylate, is a compound represented with the general formula [2] where $R^6=CH_3$, $R^7=$a tricyclodecylmethylene group $(C_{11}H_{17})$, $R^8=CH_3$, $R^9=$a tricyclodecylmethylene group $(C_{11}H_{17})$, $R^{10}=H$, $R^{11}=CH_3$, $R^{12}=CH_3OC_2H_4$, x=0.6, y=0.4, and z=0.

In the same way as the embodiment 12, synthesis was carried out using the compound obtained in the embodiment 3 in place of the compound obtained in the embodiment 1 and setting a mol ratio of the monomers to be 6:4. A copolymerization ratio of the obtained polymer was 6:4, calculating from an integration ratio of $^1$H-NMR.

Weight-Average Molecular Weight (polystyrene equivalent molecular weight)=28,000, Degree of Dispersion=2.31

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 15]

Synthesis of Poly(carboxytetracyclododecylmethacrylate-coethoxyethoxycarbonyltetracyclododecyl methacrylate represented with the general formula [27]

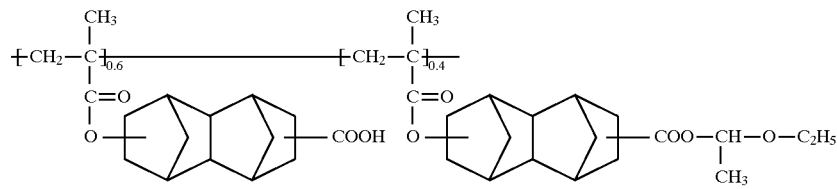

[27]

Herein, poly(carboxytetracyclododecylmethacrylate-coethoxyethoxycarbonyltetracyclododecyl methacrylate is a compound represented with the general formula [2] where $R^6=CH_3$, $R^7=$a tetracyclododecanediyl group $(C_{12}H_{16})$, $R^8=CH_3$, $R^9=$a tetracyclododecanediyl group $(C_{12}H_{16})$, $R^{10}=H$, $R^{11}=CH_3$, $R^{12}=C_2H_5$, x=0.6, y=0.4, and z=0.

In 100-ml egg-plant shaped flask having a reflux cooler equipped with a calcium chloride (CaCl$_2$) tube, 4.56 grams (0.0157 mols) of the compound obtained in the synthesis example 2 and 3.63 grams (0.0104 mols) of the compound obtained in the embodiment 4 were dissolved in 65 ml of dry tetrahydrofuran, and then 246 mg (15 mmols/liter) of AIBN was further added thereinto. Then, the mixture was stirred at the temperature in the range of 60° C. to 65° C. for six hours, and then cooled down. Then, the resultant mixture was introduced into 600 ml of ligroin. The precipitated deposit was filtered out. Another reprecipitation refining was carried out, thereby there was obtained 4.83 grams of the target material. The yield was 59%. A copolymerization ratio in the above mentioned copolymerization was 6:4, calculating from an integration ratio of $^1$H-NMR.

Weight-Average Molecular Weight (polystyrene equivalent molecular weight)=30,200, Degree of Dispersion=2.67

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 16]

Synthesis of Poly(carboxytetracyclododecylmethacrylate-cocyclohexyloxyethoxycarbonyltetracyclododecyl methacrylate represented with the general formula [28]

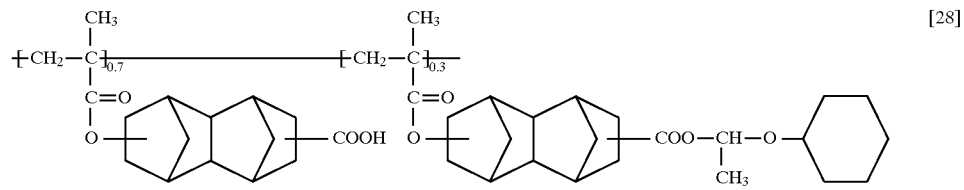

[28]

Herein, poly(carboxytetracyclododecylmethacrylate-cocyclohexyloxyethoxycarbonyltetracyclododecyl methacrylate is a compound represented with the general formula [2] where $R^6=CH_3$, $R^7=$a tetracyclododecanediyl group $(C_{12}H_{16})$, $R^8=CH_3$, $R^9=$a tetracyclododecanediyl group ($C_{12}H_{16}$), $R^{10}$=H, $R^{11}$=$CH_3$, $R^{12}$=a cyclohexyl group ($C_6H_{11}$), x=0.7, y=0.3, and z=0.

In the same way as the embodiment 15, synthesis was carried out using the compound obtained in the embodiment 5 in place of the compound obtained in the embodiment 4. As a result, there was obtained the resin by 5.70 grams. The yield was 66%. A copolymerization ratio of the above mentioned copolymerization was 7:3, calculating from an integration ratio of $^1$H-NMR.

Weight-Average Molecular Weight (polystyrene equivalent molecular weight)=28,800, Degree of Dispersion=2.55

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 17]

Synthesis of Poly(carboxytetracyclododecylmethacrylate-comethoxyethoxycarbonyltetracyclododecyl methacrylate represented with the general formula [29]

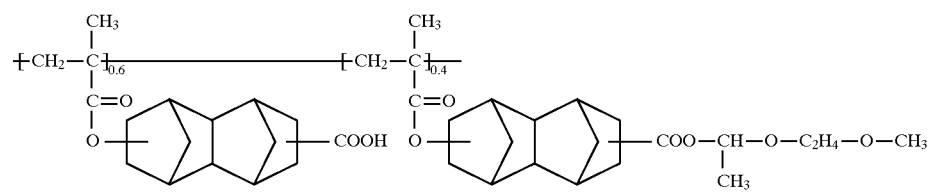

[29]

Herein, poly(carboxytetracyclododecylmethacrylate-comethoxyethoxycarbonyltetracyclododecyl methacrylate is a compound represented with the general formula [2] where $R^6$=$CH_3$, $R^7$=a tetracyclododecanediyl group ($C_{12}H_{16}$), $R^8$=$CH_3$, $R^9$=a tetracyclododecanediyl group ($C_{12}H_{16}$), $R^{10}$=H, $R^{11}$=$CH_3$, $R^{12}$=a methoxyethyl group ($CH_3OC_2H_4$), x=0.6, y=0.4, and z=0.

In the same way as the embodiment 15, synthesis was carried out using the compound obtained in the embodiment 6 in place of the compound obtained in the embodiment 4. As a result, there was obtained the resin by 5.19 grams. The yield was 62%. A copolymerization ratio of the above mentioned copolymerization was 6:4, calculating from an integration ratio of $^1$H-NMR.

Weight-Average Molecular Weight (polystyrene equivalent molecular weight)=22,000, Degree of Dispersion=2.95

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 18]

Synthesis of Poly(carboxytetracyclododecylmethacrylate-coacetoxyethoxyethoxycarbonyltetracyclododecyl methacrylate represented with the general formula [30]

Herein, poly(carboxytetracyclododecylmethacrylate-coacetoxyethoxyethoxycarbonyltetracyclododecyl methacrylate is a compound represented with the general formula [2] where $R^6$=$CH_3$, $R^7$=a tetracyclododecanediyl group ($C_{12}H_{16}$), $R^8$=$CH_3$, $R^9$=a tetracyclododecanediyl group ($C_{12}H_{16}$), $R^{10}$=H, $R^{11}$=$CH_3$, $R^{12}$=an acetoxyethyl group ($CH_3COOC_2H_4$), x=0.6, y=0.4, and z=0.

In the same way as the embodiment 15, synthesis was carried out using the compound obtained in the embodiment 7 in place of the compound obtained in the embodiment 4. As a result, there was obtained the resin by 5.19 grams. The yield was 62%. A copolymerization ratio of the above mentioned copolymerization was 6:4, calculating from an integration ratio of $^1$H-NMR.

Weight-Average Molecular Weight (polystyrene equivalent molecular weight)=19,500, Degree of Dispersion=3.01

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 19]

Synthesis of Poly(carboxytetracyclododecylmethacrylate-coadamantyloxyethoxycarbonyltetracyclododecyl methacrylate represented with the general formula [31]

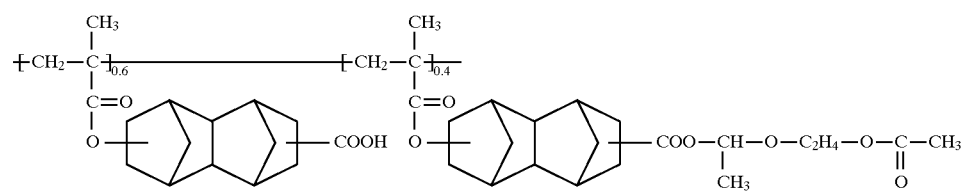

[30]

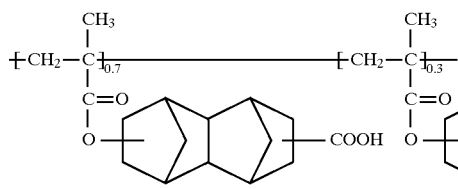

[31]

Herein, poly(carboxytetracyclododecylmethacrylate-coadamantyloxyethoxycarbonyltetracyclododecyl methacrylate is a compound represented with the general formula [2] where $R^6=CH_3$, $R^7=$a tetracyclododecanediyl group $(C_{12}H_{16})$, $R^8=CH_3$, $R^9=$a tetracyclododecanediyl group $(C_{12}H_{16})$, $R^{10}=H$, $R^{11}=CH_3$, $R^{12}=$an adamantyloxyethoxyethyl group $(C_{10}H_{15}OC_2H_4)$, x=0.6, y=0.4, and z=0.

In the same way as the embodiment 15, synthesis was carried out using the compound obtained in the embodiment 8 in place of the compound obtained in the embodiment 4. As a result, there was obtained the resin by 5.19 grams. The yield was 62%.

Weight-Average Molecular Weight (polystyrene equivalent molecular weight)=17,500, Degree of Dispersion=2.91

IR(cm$^{-1}$): 2400–3400 ($v_{O-H}$), 3048, 2960 ($v_{C-H}$), 1710 ($v_{C=O}$), 1700 ($v_{C=O}$), 1170 ($v_{C-O}$)

[Embodiment 20]

Thermal decomposition points were measured with respect to both the polymer obtained in the embodiment 12 and a compound including a tetrahydropyranyl group as a protective group and represented with the following general formula [32]. This compound is a polymer obtained in a later mentioned reference example 1. The result was shown in Table 2. It was found that the compound obtained in the embodiment 12 has a thermal decomposition point 40 degrees higher than that of the compound represented with the formula [32].

Figure 2:
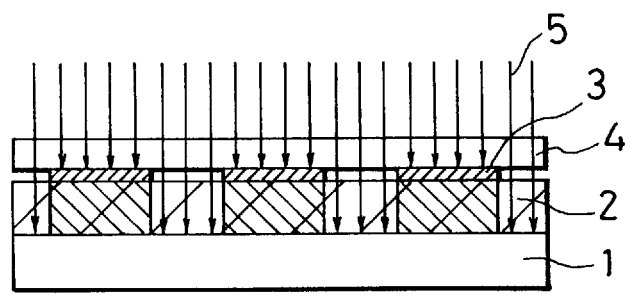
Figure 3:
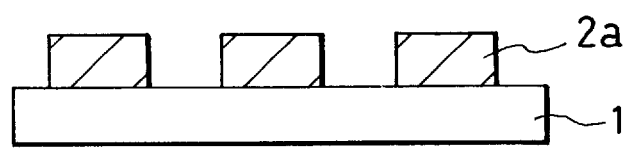
Figure 4:
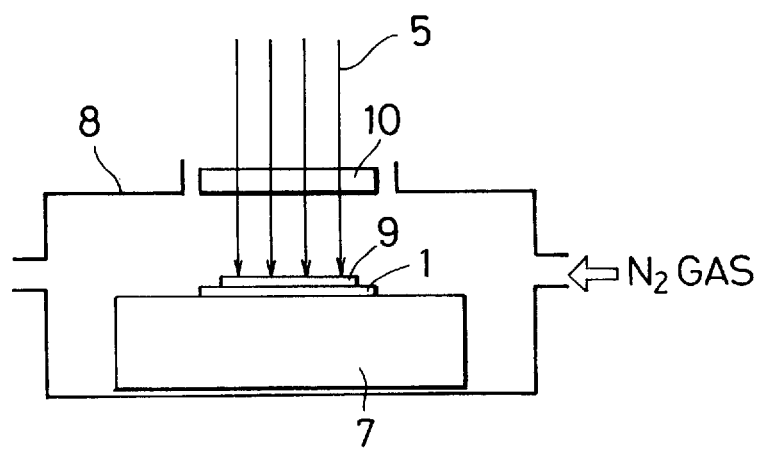
FIG. 4 is a schematic view illustrating an experimental device for exposing a wafer to a light.

3-inch thickness silicon wafer 1 by spin coating process, and then baked at 80° C. for 60 seconds on a hot plate. Thus, there was formed a thin resist layer 2 having a thickness of 0.5 μm on the wafer 1, as illustrated in FIG. 1. Then, as illustrated in FIG. 4, the wafer 1 on which the thin layer 2 was formed was placed on an X-Y stage 7 in a light-radiating apparatus 8 sufficiently purged with nitrogen. On the resist layer 2 was closely placed a mask 9 comprising a quartz plate 4 on which a pattern 3 composed of chrome was formed, and then ArF excimer laser beam 5 was irradiated to the resist layer 2 through a homogenizer 10 and further through the mask 9, as illustrated in FIGS. 2 and 4. Shortly after that, the wafer 1 was baked on a hot plate at 70° C. for 60 seconds, and then was developed by dipping in an alkaline developing reagent for 60 seconds. The alkaline developing reagent is an aqueous solution containing tetramethylammoniumhydroxide at 2.3 wt %, and was maintained at 23° C. Subsequently, the wafer 1 was rinsed in pure water for 30 seconds. As a result, only exposed regions of the resist layer 2 was dissolved and thus removed in the developing reagent, thereby there was obtained a positive type pattern 2a, as illustrated in FIG. 3.

In this experiment, 0.15 μm line and space (L/S) resolution was obtained without a surface protective film when the exposure energy was approximately 8.8 mJ/cm$^2$. The pattern 2a was resolved and observed with a scanning electron microscope (SEM) commercially available from Hitachi Co.

TABLE 2

| | Thermal Decomposition Point [°C.] |
|---|---|
| Compound of Embodiment 12 | 148° C. |
| Compound [32] | 140° C. |

[32]

[Embodiment 21]

There was prepared a resist composed of the following materials A, B and C. The experiment mentioned hereinbelow was conducted under a yellow lamp.

(A) 0.990 grams of the polymer having been synthesized in the embodiment 12.

(B) 0.010 grams of N-hydroxysucciniminotosylate (photo acid generator)

(C) 4.000 grams of propyleneglycolmonomethylether acetate (solvent)

The mixture composed of the above mentioned materials A, B and C was filtrated with a 0.2 μm teflon filter to thereby prepare a resist. The thus prepared resist was applied on a Ltd., under the tradename of SE-4100 with the result that undeveloped regions and peel-off of the pattern were not observed.

[Embodiments 22–28]

In the same way as the embodiment 21, there was prepared a resist made of the polymers obtained in the embodiments 13–19 in place of the polymer obtained in the embodiment 12, and then there was conducted an experiment on pattern resolution. In the embodiments 27 and 28, post-exposure heat treatment was carried out at 100° C. The results are shown in Table 3. The pattern was resolved and observed with SEM with the result that undeveloped regions and peel-off of the pattern were not observed.

TABLE 3

| Polymer | | Resolution [μL/S] | Exposure Dose [mJ/cm$^2$] |
|---|---|---|---|
| Embodiment 22 | Embodiment 13 | 0.15 | 18 |
| Embodiment 23 | Embodiment 14 | 0.17 | 20 |
| Embodiment 24 | Embodiment 15 | 0.20 | 19 |
| Embodiment 25 | Embodiment 16 | 0.22 | 21 |
| Embodiment 26 | Embodiment 17 | 0.16 | 18 |
| Embodiment 27 | Embodiment 18 | 0.225 | 22 |
| Embodiment 28 | Embodiment 19 | 0.25 | 20 |

[Reference Example 1]

Synthesis of Poly(carboxytricyclododecylmethylmethacrylate-cotetrahydropyranylcyclododecylmethyl methacrylate represented with the general formula [33]

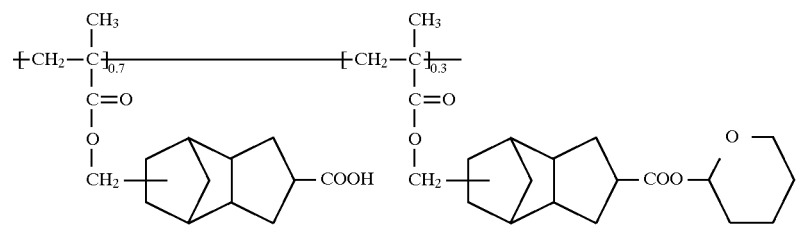

[33]

Followings were put into 200-ml flask having three inlets and equipped with a calcium chloride (CaCl$_2$) drying tube and a thermometer:

(a) 10 grams (0.022 mols) of the compound having been obtained in the synthesis example 1; and
(b) 1.85 grams (0.022 mols) of 2,3-dihydropyran.

Then, the compounds (a) and (b) were dissolved in 60 ml of methylene chloride, into which 15 mg of p-toluenesulfonic acid pyridine salt was added. Then, the resultant was stirred for an hour. After the reaction was completed, the mixture was diluted with 120 ml of diethylether, and then washed with 2.5% aqueous sodium hydroxide twice and saturated brine once. The resultant organic layer was dehydrated with magnesium sulfate, and then filtered out. By using an evaporator, the solvent was removed, thereby there was obtained 11.4 grams of tetrahydropyranyltricyclodecanylmethylmethacrylate in the form of viscous liquid. The yield was 96%.

Then, in 100-ml egg-plant shaped flask having a reflux cooler equipped with a calcium chloride (CaCl$_2$) tube, 7.75 grams (0.021 mols) of the thus obtained tetrahydropyranyltricyclodecanylmethylmethacrylate and 13.9 grams (0.05 mols) of the compound obtained in the synthesis example 1 were dissolved in 80 ml of dry tetrahydrofuran, and then 646 mg (39 mmols/liter) of AIBN was further added thereinto. Then, the mixture was stirred at the temperature in the range of 60° C. to 65° C. for six hours, and then cooled down. Then, the resultant mixture was introduced into 600 ml of ligroin. The precipitated deposit was filtered out. Another reprecipitation refining was carried out, thereby there was obtained 13.6 grams of the target material. The yield was 63%.

Weight-Average Molecular Weight (polystyrene equivalent molecular weight)=29,600, Degree of Dispersion=2.29

IR(cm$^{-1}$): 2400–3400 ($v_{O-H}$), 3049, 2960 ($v_{C-H}$), 1710 ($v_{C=O}$), 1700 ($v_{C=O}$), 1170 ($v_{C-O}$)

[Reference Example 2]

Synthesis of Poly(carboxytricyclododecylmethylmethacrylate-co-t-butoxycarbonyltricyclodecylmethyl methacrylate represented with the general formula [34]

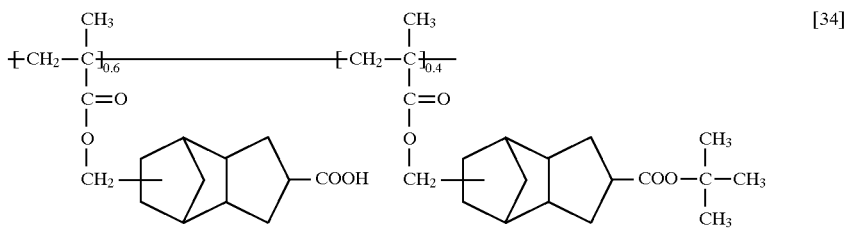

[34]

In a 200-ml flask having three inlets, 10 grams of the compound having been obtained in the synthesis example 1 were dissolved in toluene, and 8 grams of t-butanol and 20 grams of trifluoromethanecarboxylic acid anhydride were added thereinto. The mixture was stirred at room temperature (RM) for three hours. Then, 100 ml of ether was added into the resultant mixture, which was washed with 2.5% NaOH aqueous solution seven times and then saturated NaCl aqueous solution two times. Then, the solvent was removed under reduced pressure. As a result, there was obtained 5.5 grams of t-butylbonyltricyclodecanylmethylmethacrylate. The yield was 43.2%.

Then, in 100-ml egg-plant shaped flask having a reflux cooler equipped with a calcium chloride (CaCl$_2$) tube, 2 grams (0.007 mols) of the thus obtained t-butylbonyltricyclodecanylmethylmethacrylate and 10.42 grams (0.029 mols) of the compound obtained in the synthesis example 1 were dissolved in 50 ml of dry tetrahydrofuran, and then 163 mg (20 mmols/liter) of AIBN was further added thereinto. Then, the mixture was stirred at the temperature in the range of 60° C. to 65° C. for six hours, and then cooled down. Then, the resultant mixture was introduced into 600 ml of ligroin. The precipitated deposit was filtered out. Another reprecipitation refining was carried out, thereby there was obtained 5.5 grams of the target material. The yield was 59%.

Weight-Average Molecular Weight (polystyrene equivalent molecular weight)=28,000, Degree of Dispersion=2.25

IR(cm$^{-1}$): 2800–3400 ($v_{O-H}$), 3048, 2960 ($v_{C-H}$), 1710 ($v_{C=O}$), 1700 ($v_{C=O}$), 1170 ($v_{C-O}$)

[Reference Example 3]

There was prepared a resist composed of the following materials A, B and C. The experiment mentioned hereinbelow was conducted under a yellow lamp.
(A) 0.950 grams of the polymer having been synthesized in the reference example 1
(B) 0.050 grams of N-hydroxysuccinimidetoluenesulfonate (photo acid generator)
(C) 4.000 grams of propyleneglycolmonomethylether acetate (solvent)

The mixture composed of the above mentioned materials A, B and C was filtrated with a 0.2 μm teflon filter to thereby prepare a resist. The thus prepared resist was applied on a 3-inch thickness silicon substrate by spin coating process, and then baked at 90° C. for 60 seconds on a hot plate. Thus, there was formed a thin resist layer having a thickness of 0.7 μm on the substrate. Then, the substrate on which the thin layer was formed was placed in a light-radiating apparatus sufficiently purged with nitrogen. On the resist layer was closely placed a mask comprising a quartz plate on which a pattern composed of chrome was formed, and then ArF excimer laser beam was irradiated to the resist layer through the mask. Shortly after that, the substrate was baked on a hot plate at 90° C. for 60 seconds, and then was developed by dipping in an alkaline developing reagent for 60 seconds. The alkaline developing reagent is an aqueous solution containing tetramethylammoniumhydroxide at 2.3 wt %, and was maintained at 23° C. Subsequently, the substrate was rinsed in pure water for 60 seconds. As a result, only exposed regions of the resist layer was dissolved and thus removed in the developing reagent, thereby there was obtained a positive type pattern.

In this experiment, 0.25 μm line and space (L/S) resolution was obtained, when the exposure energy was approximately 47.3 mJ/cm$^2$. The pattern was resolved and observed with SEM with the result that resist residue or scum was observed.

[Reference Example 4]

There was prepared a resist composed of the following materials A, B and C. The experiment mentioned hereinbelow was conducted under a yellow lamp.
(A) 0.950 grams of the polymer having been synthesized in the reference example 2
(B) 0.050 grams of N-hydroxysuccinimidetoluenesulfonate (photo acid generator)
(C) 4.000 grams of propyleneglycolmonomethylether acetate (solvent)

The mixture composed of the above mentioned materials A, B and C was filtrated with a 0.2 μm teflon filter to thereby prepare a resist. The thus prepared resist was applied on a 3-inch thickness silicon wafer by spin coating process, and then baked at 90° C. for 60 seconds on a hot plate. Thus, there was formed a thin resist layer having a thickness of 0.5 μm on the wafer. Then, the wafer was placed in a light-radiating apparatus sufficiently purged with nitrogen. On the resist layer was closely placed a mask comprising a quartz plate on which a pattern composed of chrome was formed, and then ArF excimer laser beam was irradiated to the resist layer through the mask. Shortly after that, the wafer was baked on a hot plate at 1100° C. for 60 seconds, and then was developed by dipping in an alkaline developing reagent for 60 seconds. The alkaline developing reagent is an aqueous solution containing tetramethylammoniumhydroxide at 2.3 wt %, and was maintained at 23° C. Subsequently, the substrate was rinsed in pure water for 30 seconds. As a result, a fine pattern was not formed.

As having been described in connection with the preferred embodiments, the photoresist made in accordance with the present invention does not produce by-product polymer, and hence makes it possible to form a fine resist pattern without resist residue or scum. In addition, the photoresist is thermally stable.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A photoresist comprising: a resin composed of a polymer including a compound represented with the following general formula [1] within a structural unit thereof; and a photo acid generator:

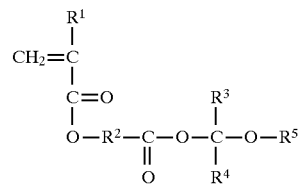

[1]

wherein $R^1$ represents one of a hydrogen atom and a methyl group, $R^2$ represents a divalent hydrocarbon group including a bridged cyclic hydrocarbon group and having a carbon number in the range of 7 to 13 both inclusive, $R^3$ represents one of a hydrogen atom and a hydrocarbon group having a carbon number of 1 or 2, $R^4$ represents a hydrocarbon group having a carbon number of 1 or 2, and $R^5$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive.

2. The photoresist as set forth in claim 1, wherein said resin has a weight percent in the range of 75 to 99.8 both inclusive, and said photo acid generator has a weight percent in the range of 0.2 to 25.

3. The photoresist as set forth in claim 2, wherein said resin has a weight percent in the range of 85 to 99 both inclusive, and said photo acid generator has a weight percent in the range of 1 to 15.

4. The photoresist as set forth in claim 1, wherein said photo acid generator is one represented with the following general formula [6]

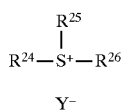

[6]

wherein each of $R^{24}$ and $R^{25}$ represents one of straight-chain, branch-type and cyclic alkyl groups, and $R^{26}$ represents one of (a) a straight-chain, branch-type or cyclic alkyl group, (b) a 2-oxo cyclic alkyl group, (c) a 2-oxo straight-chain alkyl group, and (d) a 2-oxo branch-type alkyl group, and Y- represents ion pairs.

5. The photoresist as set forth in claim 1, wherein said photo acid generator is one represented with the following general formula [7]

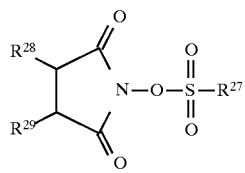

[7]

wherein $R^{27}$ represents one of (a) a straight-chain, branch-type or cyclic alkyl group, (b) a replaced aromatic ring, and (c) a non-replaced aromatic ring, and each of $R^{28}$ and $R^{29}$ represents one of (a) a straight-chain, branch-type or cyclic alkyl group and (b) a straight-chain, branch-type or cyclic haloalkyl group.

6. A photoresist comprising: a resin composed of a polymer represented with the following general formula [2]; and a photo acid generator

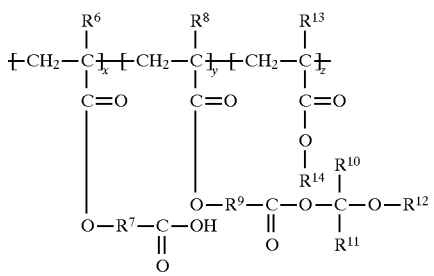

[2]

wherein each of $R^6$, $R^8$ and $R^{13}$ represents one of a hydrogen atom and a methyl group, each of $R^7$ and $R^9$ represents a divalent hydrocarbon group including a bridged cyclic hydrocarbon group and having a carbon number in the range of 7 to 13 both inclusive, $R^{10}$ represents one of a hydrogen atom and a hydrocarbon group having a carbon number of 1 or 2, $R^{11}$ represents a hydrocarbon group having a carbon number of 1 or 2, $R^{12}$ represents one of (a) a hydrocarbon group having a carbon number in the range of 1 to 12 both inclusive, (b) a hydrocarbon group having a carbon number in the range of 1 to 12 both inclusive and replaced with an alkoxy group having a carbon number in the range of 1 to 12 both inclusive, and (c) a hydrocarbon group having a carbon number in the range of 1 to 12 both inclusive and replaced with an acyl group having a carbon number in the range of 1 to 13 both inclusive, $R^{14}$ represents one of a hydrogen atom and a hydrocarbon group having a carbon number in the range of 1 to 10 both inclusive, x+y+z=1, x is in the range of 0.1 to 0.9, y is in the range of 0.1 to 0.7, and z is in the range of 0 to 0.7.

7. The polymer as set forth in claim 6, wherein said polymer has a weight average molecular weight in the range of 1,000 to 500,000 both inclusive.

8. The photoresist as set forth in claim 6, wherein said resin has a weight percent in the range of 75 to 99.8 both inclusive, and said photo acid generator has a weight percent in the range of 0.2 to 25.

9. The photoresist as set forth in claim 8, wherein said resin has a weight percent in the range of 85 to 99 both inclusive, and said photo acid generator has a weight percent in the range of 1 to 15.

10. The photoresist as set forth in claim 6, wherein said photo acid generator is one represented with the following general formula [6]

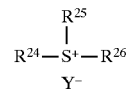

[6]

wherein each of $R^{24}$ and $R^{25}$ represents one of straight-chain, branch-type and cyclic alkyl groups, and $R^{26}$ represents one of (a) a straight-chain, branch-type or cyclic alkyl group, (b) a 2-oxo cyclic alkyl group, (c) a 2-oxo straight-chain alkyl group, and (d) a 2-oxo branch-type alkyl group, and Y- represents ion pairs.

11. The photoresist as set forth in claim 6, wherein said photo acid generator is one represented with the following general formula [7]

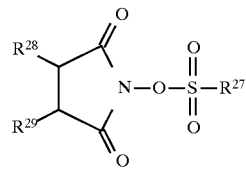

[7]

wherein $R^{27}$ represents one of (a) a straight-chain, branch-type or cyclic alkyl group, (b) a replaced aromatic ring, and (c) a non-replaced aromatic ring, and each of $R^{28}$ and $R^{29}$ represents one of (a) a straight-chain, branch-type or cyclic alkyl group and (b) a straight-chain, branch-type or cyclic haloalkyl group.

* * * * *